United States Patent [19]
Brillouet et al.

[11] Patent Number: 6,052,398
[45] Date of Patent: Apr. 18, 2000

[54] SURFACE EMITTING SEMICONDUCTOR LASER

[75] Inventors: Francois Brillouet, Clamart; Joël Jacquet, Limours; Paul Salet, Clamart; Léon Goldstein, Cherville; Patrick Garabedian, Arpajon; Christophe Starck, Ste-Genevieve-des-Bois; Julien Boucart, Paris, all of France

[73] Assignee: Alcatel, Paris, France

[21] Appl. No.: 09/053,704

[22] Filed: Apr. 2, 1998

[30] Foreign Application Priority Data

Apr. 3, 1997 [FR] France ................................. 97 04074

[51] Int. Cl.$^7$ ........................................................ H01S 3/19
[52] U.S. Cl. ................................ 372/46; 372/45; 372/50; 372/46
[58] Field of Search ................................ 372/43, 44, 45, 372/46, 50, 96, 99

[56] References Cited

U.S. PATENT DOCUMENTS 5,212,706  5/1993  Jain .............................................. 372/50

FOREIGN PATENT DOCUMENTS

0709939A1  5/1996  European Pat. Off. .

OTHER PUBLICATIONS

A. R. Sugg et al, N–P–(P+–N+)–N ALYGA1–YAS–GAAS–INXGA1–XAS Quantum–Well Laser With P+–N+ GAAS–INGAAS Tunnel Contact On N–GASS, *Applied Physics Letters*, vol. 62, No. 20, May 17, 1993, pp. 2510–2512.

D. I. Babic et al. "Room–Temperature Continuous–Wave Operation Of 1.54–MU M Vertical–Cavity Lasers", *IEEE Photonics Technology Letters*, vol. 7, No. 11, Nov. 1, 1995, pp. 1225–1227.

Patent Abstracts of Japan, vol. 018, No. 080 (E–1505), Feb. 9, 1994 Corresponding to JP 05 291698 A (NEC Corporation) Nov. 5, 1993.

*Primary Examiner*—Hemang Sanghavi
*Assistant Examiner*—Benjamin Cushwa
*Attorney, Agent, or Firm*—Sughrue, Mion, Zinn Macpeak & Seas, PLLC

[57] ABSTRACT

Two semiconductor layers of the laser form a tunnel junction enabling an electrical current for pumping the laser to pass from an N doped semiconductor Bragg mirror to a P doped injection layer belonging to the light-amplifying structure. The Bragg mirror co-operates with another mirror of the same type having the same doping to include said structure in an optical cavity of the laser. In a variant, the tunnel junction may be buried and located so as to constitute confinement means for said pumping current. The laser can be used in an optical fiber communications network.

10 Claims, 5 Drawing Sheets

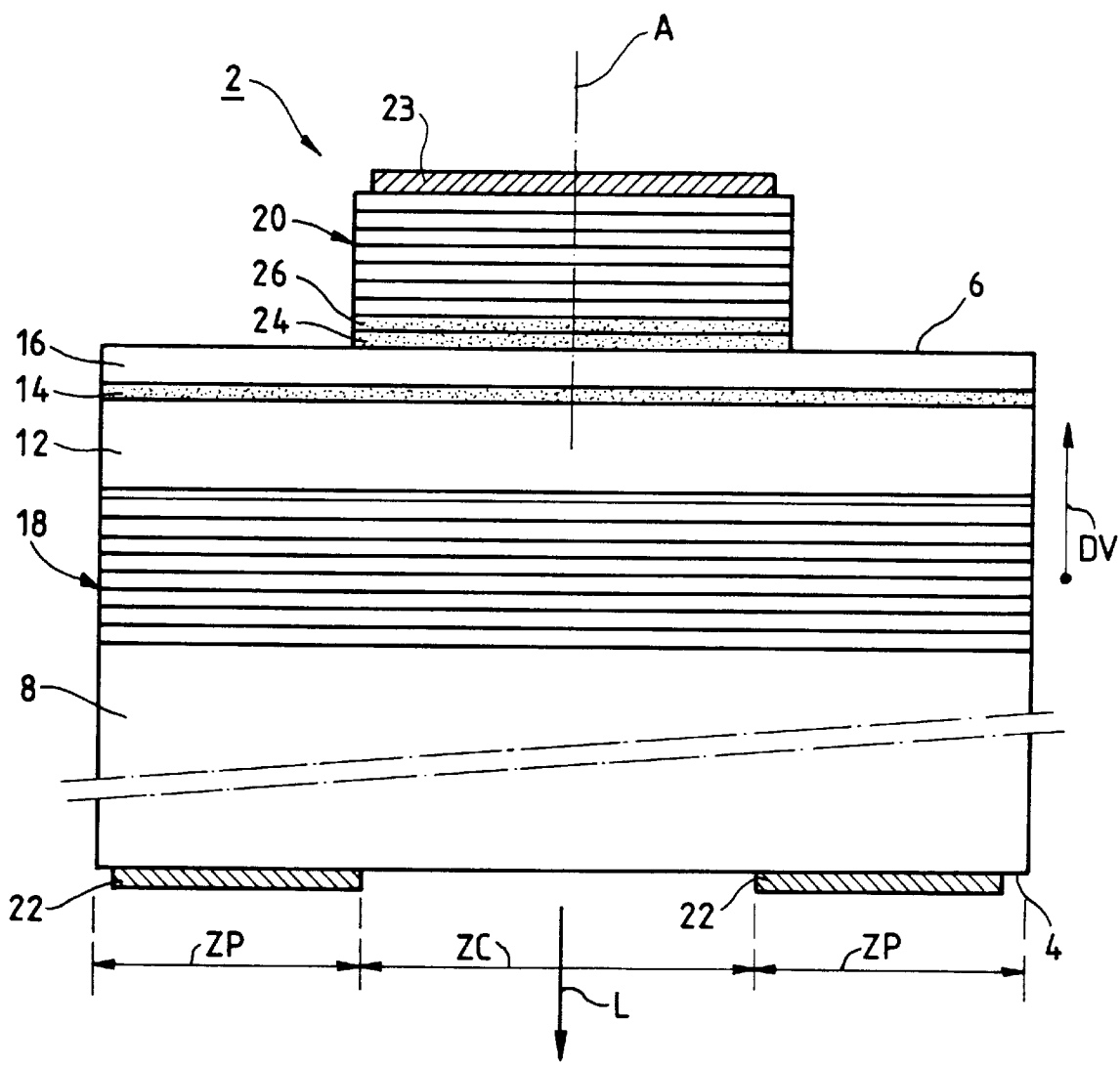
FIG_1

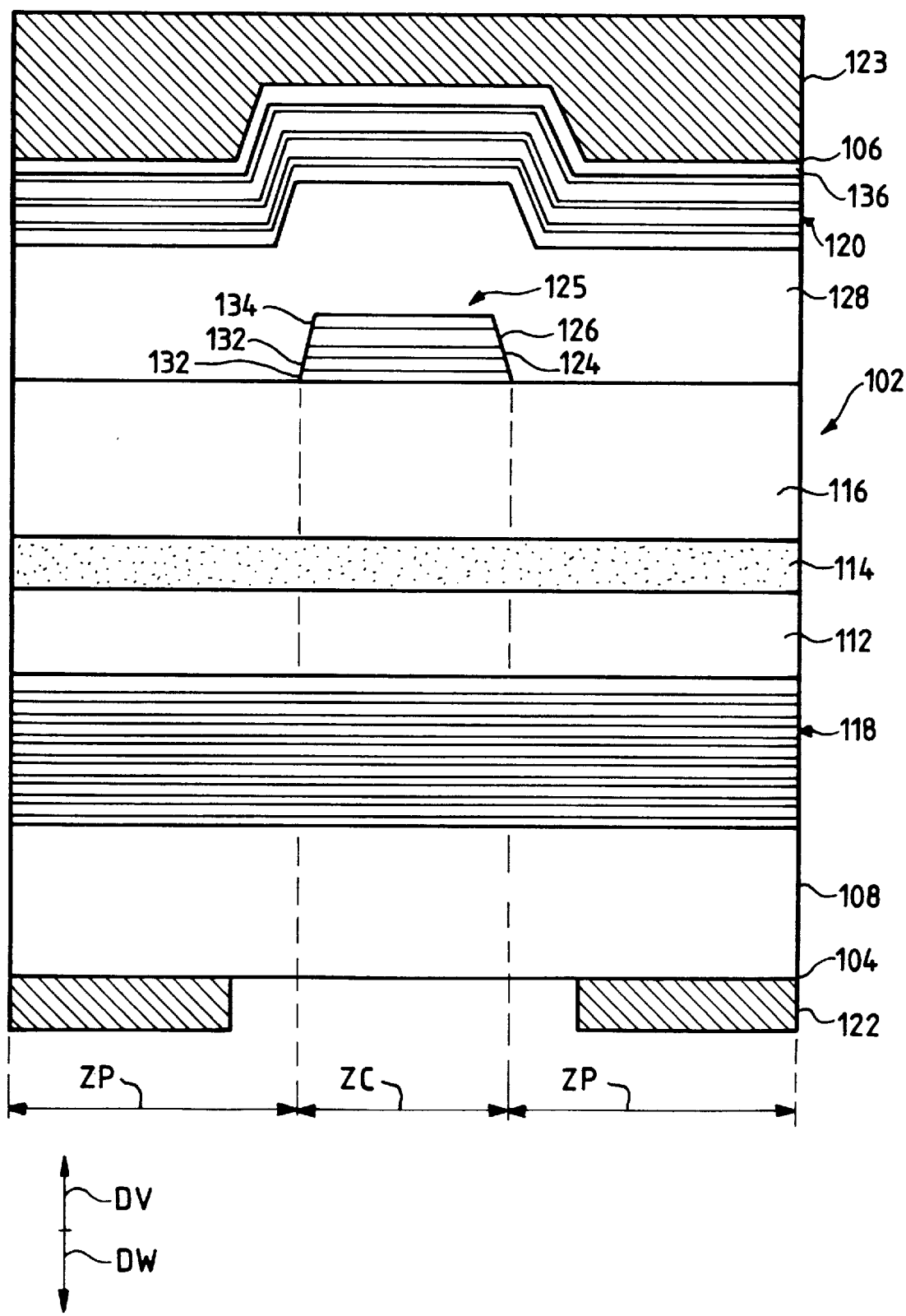
FIG_2

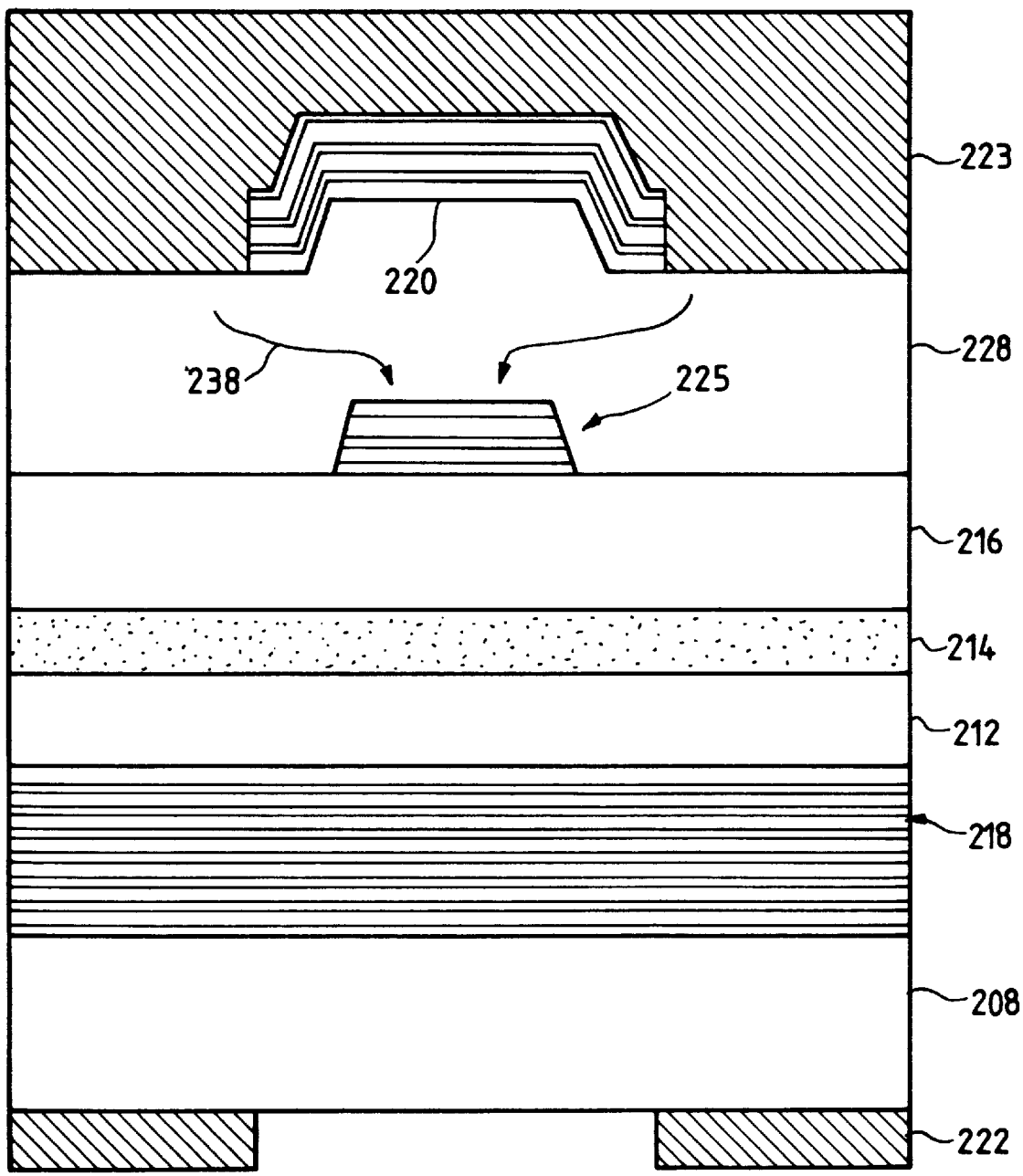
FIG_3

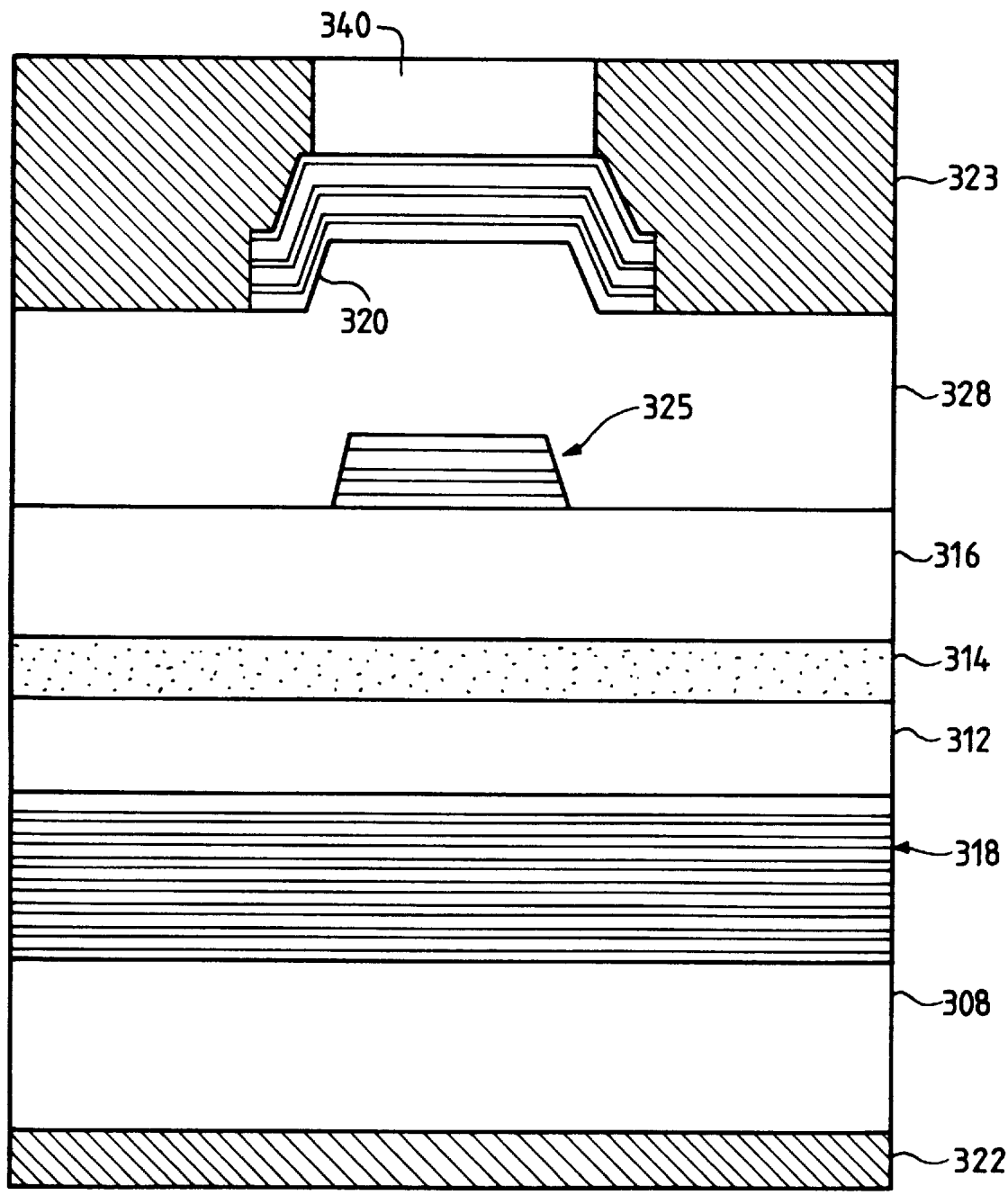
FIG_4

FIG_5
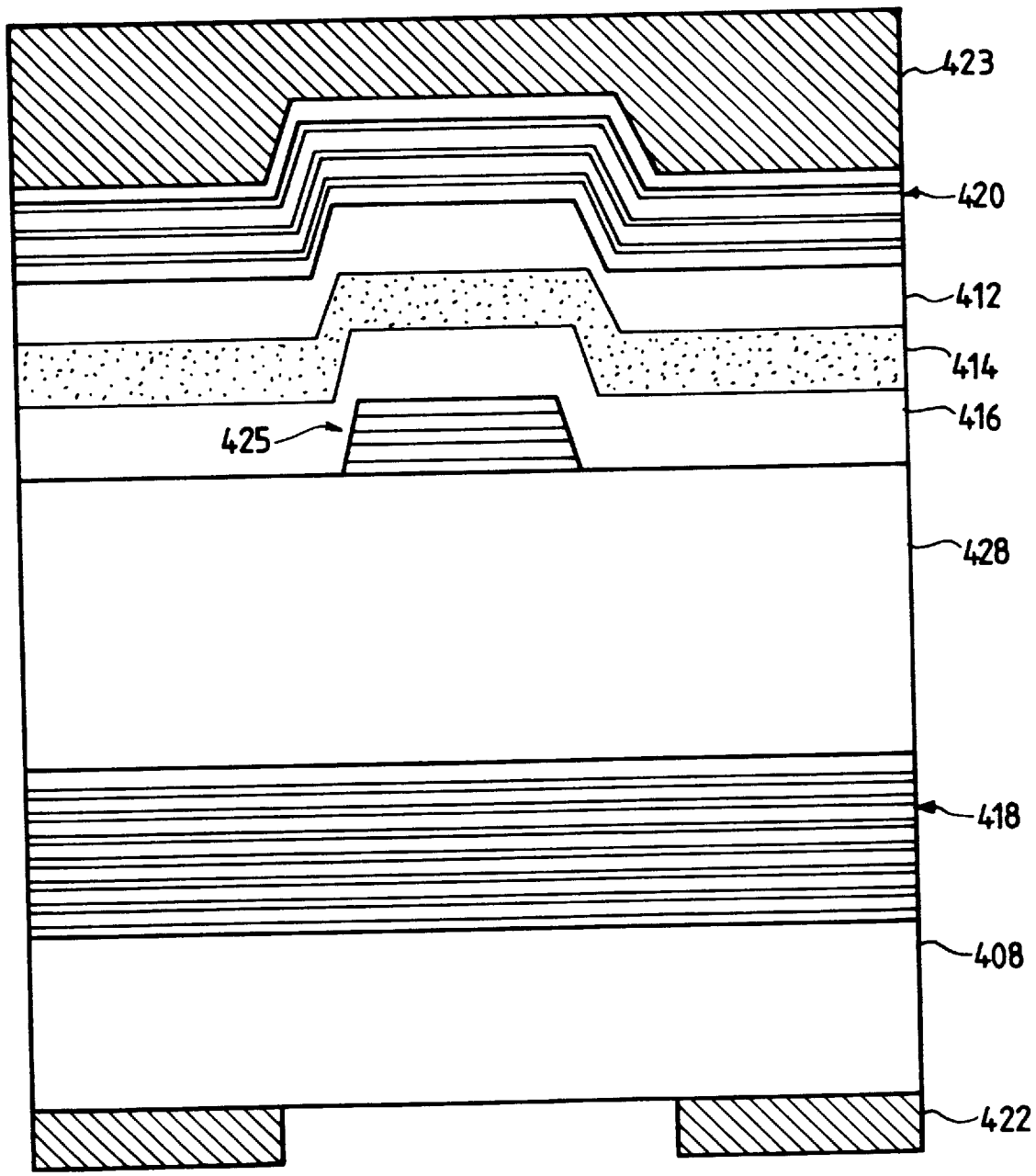

SURFACE EMITTING SEMICONDUCTOR LASER

The present invention relates to surface emitting semiconductor lasers, i.e. to lasers of the vertical cavity surface emitting laser (VCSEL) type. It enables mirrors to be made that present simultaneously several qualities that are desirable for making the optical cavity of such a laser. The invention is particularly applicable when the light that is to be emitted by such a laser is to have a wavelength in the vicinity of 850 nm, 980 nm, 1300 nm, or 1550 nm so as to be situated in one of the spectral windows commonly used in optical fiber communications systems.

BACKGROUND OF THE INVENTION

In known manner, such light is generated in the active layer of a light-amplifying structure through which there passes a pumping current, and said structure is included in a monocrystalline chip made of a semiconductor material having III–V type binary composition, i.e. gallium arsenide AsGa or indium phosphide InP. Such a chip is fabricated by epitaxially growing layers one on another from a substrate. In the description below and as is the common practice, it is assumed that the substrate constitutes the bottom portion of the chip. Conventionally, and advantageously, the substrate has N-type doping and the layers of the amplifying structure necessarily form an N I P sequence, with the top layers of the chip usually having P-type doping.

The optical cavity of the laser is constituted by a bottom mirror and by a top mirror formed respectively on a bottom face and on a top face of the chip. In a known disposition which is adopted in the context of various implementations of the present invention, the pumping current is delivered to the amplifying structure through the top mirror. The light to be emitted then escapes from the cavity through the bottom mirror. In the typical case of the top mirror occupying only a fraction of the horizontal surface area of the chip, and where there is only a short distance between the top mirror and the amplifying structure, that known disposition has the advantage of ensuring the required coincidence between two zones of the surface of said structure, i.e. the zone through which pumping current passes and the zone which is included in the optical cavity. However, passing the current through the top mirror presents a problem when making the mirror. The problem is due to the fact that the mirror must simultaneously present both very high reflectance, preferably at least 99.5% so as to enable optical oscillation to build up in the cavity, and flow electrical resistance, preferably less than $10^{-4}$ $\Omega/cm^2$ if resistance is considered per unit area, and in any event the resistance must be small enough to allow the pumping current to flow, e.g. at a density of 10 $kA/cm^2$, while avoiding troublesome losses and heating due to the Joule effect.

In a first known surface emitting semiconductor laser, sufficiently low electrical resistance is obtained by using a metal mirror. Unfortunately, reflectance then has a maximum of about 97% and as a general rule that is insufficient.

That is why, in a second known surface emitting semiconductor laser, a doped semiconductor Bragg mirror is used. Such a mirror is formed by superposing layers having alternating refractive indices. To enable their crystal lattices to match the lattice of the chip, these layers are conventionally constituted by alternating layers of indium-gallium arsenide-phosphide, and of indium phosphide for an indium phosphide chip. For the same reason, the layers are conventionally constituted by aluminum-gallium arsenide and by gallium arsenide with a gallium arsenide chip. They can be doped so as to obtain the desired low electrical resistance.

That second known laser is described in a communication by D. Babic et al., IPRM 95, "Transverse mode and polarization characteristics of double-fused 1.52 $\mu$m vertical-cavity laser", pp. 773–776. Both mirrors in that laser are semiconductor Bragg mirrors. To enable the pumping current to pass through, the bottom mirror situated on the N side of the amplifying structure is N-type doped, while the top mirror situated on the P side of the structure is P-type doped. In that laser, the chip is based on indium phosphide to enable light to be delivered at a wavelength of 1520 nm. To limit light absorption by having mirrors of limited thickness, the mirrors are based on gallium arsenide. When fabricating such lasers, each mirror must be disposed on one face, e.g. a top face, of a baseplate of relatively thick indium phosphide. For that purpose, the mirror is initially fabricated by epitaxial deposition on a is relatively thick substrate of gallium arsenide. Thereafter, it is assembled to the indium phosphide baseplate by thermal fusing. The substrate reinforces the baseplate mechanically such that the opposite face of the baseplate, e.g. its bottom face, can then be etched to make it thinner. A second operation of the same type then makes it possible to deposit the second mirror so as to form an optical cavity of appropriate length, with said length being measured vertically, i.e. in the thickness direction of the baseplate. On this topic, reference may also be made to an article published by D. I. Babic, K. Streubel, R. P. Mirin, N. M. Yargalit, E. L. Hu, D. E. Mars, L. Yang, and K. Carey, in Photon. Techn. Lett., Vol. 7, 1225, 1995.

Document EP-A-0 709 939 (Hewlett Packard Co.) describes a third known surface emitting semiconductor laser. That laser is included in a matrix of lasers of the same type. An object of that document for that laser is that it should be controlled on the N-type doping side of its light amplifying semiconductor structure ("N drive", to facilitate control) while being formed on an N-type substrate (that of the matrix, for the purpose of avoiding harmful diffusion of zinc which would otherwise be included in the substrate to give it P-type conductivity). In spite of the fact that the amplifying structure is an N I P structure, i.e. the doping on the two sides of the structure is of opposite types, the object is achieved by a tunnel junction formed for that purpose in the chip and electrically interposed in series between the structure and the substrate. The junction is reverse-biased, but the-two layers constituting it receive doping at sufficient concentration to enable it to transmit the pumping current by the tunnel effect. The mirrors situated on the N-doped and P-doped sides of the amplifying structure are Bragg mirrors having respective N and P types of doping. The tunnel junction is formed between the mirror having P-type doping and the substrate.

Those second and third known lasers suffer in particular from the drawback of the semiconductor materials which constitute the top mirror absorbing the light of the laser to such an extent that the reflectance of the mirror is less than the desired value.

This drawback is a result of the fact that binary semiconductor materials with P doping present an absorption coefficient for said light which is greater than that of materials having N-type doping. The coefficient increases with increasing wavelength of the light.

OBJECTS AND SUMMARY OF THE INVENTION

A general object of the present invention is to enable surface emitting semiconductor lasers having qualities desired for such lasers to be fabricated economically. A more particular object of the invention is to enable the top mirrors of such lasers to be given both high reflectance and low electrical resistance, particularly for the purpose of emitting light at wavelengths associated with indium phosphide.

With these objects, the invention provides a surface emitting semiconductor laser, said laser comprising an optical cavity and a light-amplifying structure situated in said cavity and defining the direction of a laser pumping current, wherein said optical cavity is placed electrically in series between two extreme semiconductor layers belonging to said laser and having the same conductivity type, two semiconductor layers of said laser being placed optically in series with said cavity and constituting a tunnel junction enabling said pumping current to pass in series through said amplifying structure and said junction in the reverse direction of said junction.

The indications given above concerning light absorption show that in the context of presently known techniques, it is preferable for the doping of the mirrors of a surface emitting laser to be N type when both of the mirrors are Bragg mirrors made of semiconductor layers. Under such circumstances, the disposition of the present invention makes it possible to achieve the above-mentioned more particular object by enabling the optical cavity of such a laser to be made using two mirrors with N-type doping. Nevertheless, it must be understood that in the event of technological progress making it advantageous to make the optical cavity of such a laser with two P-type mirrors, the same disposition would enable said advantage to be obtained in making such lasers. The types of doping in the semiconductor layers of the surface emitting lasers described below are adapted to the case where the mirrors of the laser have N-type doping.

In addition, when a semiconductor substrate with N-type doping has a dielectric layer mirror to constitute the bottom mirror of a surface emitting laser formed on said substrate, the present invention makes it possible for the top mirror of the laser to be made in the form of a semiconductor layer mirror having N-type doping and thus obtain the advantages that result from the electrical and optical characteristics associated with this type of doping.

In this case as well as in the case where both mirrors of the optical cavity of such a laser are made up of semiconductor layers, it must be understood that the tunnel junction provided by the present invention can be situated on one side or the other of the light-amplifying structure of the laser.

BRIEF DESCRIPTION OF THE DRAWINGS

Five embodiments of the invention are described below, merely by way of example, and with reference to the accompanying diagrammatic figures.

FIG. 1 is an axial vertical section view of a first laser of the invention.

FIG. 2 is an axial vertical section view of a second laser of the invention, this second laser constituting a referred embodiment of the invention.

FIG. 3 is an axial vertical section view of a third laser of the invention.

FIG. 4 is an axial vertical section view of a fourth laser of the invention.

FIG. 5 is an axial vertical section view of a fifth laser of the invention.

MORE DETAILED DESCRIPTION

Like the other lasers given by way of example, the chip of the first laser shown in FIG. 1 is constituted by an essentially monocrystalline semiconductor assembly. The assembly is built up by growing a succession of deposits on a substrate. The substrate has an axis A and an area which extends in a plane perpendicular to said axis. Said axis and said area also constitute an axis and an area of said chip. The area has a central zone ZC in the vicinity of the axis A and a peripheral zone ZP around said central zone. The thickness of the chip defines a vertical direction DV parallel to the axis A.

More particularly, the chip 2 of this first laser has a bottom face 4 and a top face 6 and comprises mutually superposed layers. Unless stated otherwise, these layers are made of indium phosphide. Going from the bottom face to the top face, these layers are as follows:

The substrate 8. This substrate is of a thickness giving it mechanical strength enabling the chip to be handled, either on its own, or else typically in the form of a wafer including a plurality of chips.

A bottom mirror 18. This mirror is a semiconductor Bragg mirror with N-type doping. It is formed on the top face 4 of the substrate 8 in continuity with the substrate. It extends over both the central zone ZC and the peripheral zone ZP. It is made up of 40 to 50 pairs of layers, each constituted by a layer of indium phosphide and a layer of indium-gallium phosphide-arsenide. These layers have alternating refractive indices nH=3.4 and nL=3.17, and optical thicknesses equal to one-fourth the wavelength of the laser light, which is 1520 nm, for example. The total thickness of the mirror is about 10 $\mu$m. Its doping concentration may be $2\times10^{18}$ cm$^{-3}$, for example. The mirror 18 could also be made dielectric layers.

A first injection layer 12 having N-type doping. The thickness of this layer is 1 $\mu$m and its doping concentration lies in the range $5\times10^{17}$ cm$^{-3}$ to $2\times10^{18}$ cm$^{-3}$.

A composite active layer 14 suitable for amplifying light by recombining charge carriers of opposite types. This layer typically comprises five to eight quantum wells under compression stress. These wells, and the barriers between them are made in conventional manner of indium-gallium arsenide-phosphide with varying proportions of said components. The layer may also be constituted by a solid piece of material. Its thickness lies typically in the range about 100 nm to 400 nm.

A second injection layer 16 of P-type doping. This layer has a thickness of 1 $\mu$m and a doping concentration of $5\times10^{17}$ cm$^{-3}$ to $2\times10^{18}$ cm$^{-3}$. Passing a laser pumping current between the first and second injection layers causes said charge carriers of opposite types to be injected into the active layer. These injection layers and the active layer constitute a light-amplifying structure.

Finally, a top mirror 20. This mirror is likewise constituted by a semiconductor Bragg mirror having N-type doping, and by way of example it is identical to the mirror 18. It is formed on the top face 6 of the chin 2 in continuity with the chip. It occupies only the central zone ZC. Together with the bottom mirror it constitutes the optical cavity of the laser. This cavity extends along the axis A. Its length, i.e. the distance between the top and bottom mirrors has an appropriate value such as 4 $\mu$m.

A bottom portion of the top mirror 20 comprises, superposed in the vertical direction DV going from the second injection layer 16 and in continuity with said layer:

a layer 24 having P-type doping; and
a layer 26 having N-type doping.

These two layers constitute a semiconductor junction that the laser pumping current subjects to reverse electrical bias tending to oppose the passage of the current. However these layers have high doping concentrations, and in particular concentrations greater than those of the second injection layer 16 and of the top mirror 20. More precisely, these concentrations are high enough for a tunnel effect to enable this junction to conduct the pumping current from the top mirror to the second injection layer without giving rise to a troublesome potential drop. That is why such a junction is known as a "tunnel junction", the layers 24 and 26 being respectively referred to below as "the first layer of the tunnel junction" and "the second layer of the tunnel junction".

It is known that doping concentrations that are high enough to constitute a tunnel junction give rise to strong light absorption in the doped material. In the context of the present invention, it has nevertheless been found that in spite of the large power drop which could result from light passing through a semiconductor material doped in this way, it is possible without spoiling current conduction to limit the thicknesses of the tunnel junction layers to values that are small enough to ensure that the overall absorption of light is itself small enough to avoid significantly disturbing the establishment of appropriate light oscillation in the optical cavity of the laser.

More precisely, each of the tunnel junction layers 24 and 26 preferably has a thickness lying in the range 10 nm to 300 nm, and more particularly lying in the range about 15 nm to 50 nm. Also preferably, the tunnel junction layer 24 is constituted by indium and gallium phosphide and arsenide and has doping at a concentration of not less than $3 \times 10^{19}$ $cm^{-3}$, for example in the vicinity of $8 \times 10^{19}$ $cm^{-3}$. Also preferably, the top connection layer 26 has N doping at a concentration greater than $10^{18}$ $cm^{-3}$, and for example in the vicinity of $3 \times 10^{18}$ $cm^{-3}$.

The first laser given by way of example further comprises:
- a bottom electrode 22 formed on the substrate 8; and
- a top electrode 23 formed on the top mirror 20 and co-operating with the bottom electrode 22 to allow the laser pumping current to pass through the chip 2.

The bottom electrode 22 is formed on the substrate 8 in the peripheral zone ZP, to the exclusion of the central zone ZC, so as to allow the light L of this laser to escape from the chip 2 through the bottom face 4 in said central zone. Those of said layers which are situated between said bottom face and the active layer 14 are of thicknesses and electrical conductivities that give them conductivity in horizontal directions greater than that which results from the thicknesses and electrical conductivities of those said layers which are situated between said active layer and the top face 6. The ratio of these two conductivities in horizontal directions is large enough for the pumping current passing through the active layer 14 to be concentrated in the central zone ZC which constitutes an active zone for the light-amplifying structure. In addition, this disposition ensures good uniformity in the horizontal distribution of the current where it passes through the active layer. This distribution could be substantially the same if the bottom mirror were of the dielectric layer type and if it were formed in the central zone only, with the bottom electrode then being formed in the peripheral zone directly on the bottom face of the chip.

In the practical implementation of a wafer having numerous semiconductor chips, the central zones such as ZC have diameters in the range 5 µm to 20 µm while the peripheral zones such as ZP have diameters close to 0.25 mm. The voltage required across the terminals of the laser to enable it to operate has been found to be in the vicinity of 3 V.

In the laser described above, the N-type top mirror is constituted by materials having the same crystal lattice as the indium phosphide chip. Nevertheless, it is possible to make the mirror by alternating layers of gallium arsenide GaAs and of gallium-aluminium arsenide GaAlAs, said layers still being of N type, but having a crystal lattice that does not match that of the indium phosphide chip. The bonding between such a mirror and such a chip can be implemented by a fusion bond using the method known as "wafer fusion". It may also be implemented by forming said mirror by depositing its component layers using a method similar to that known for making epitaxial deposits. This type of deposition leads to layers being formed that can be said to be "metamorphic".

The tunnel junction can then be made between the two layers of gallium arsenide constituting the top mirror, or at the interface between a layer of quaternary composition having the same crystal lattice as indium phosphide and the first layer of gallium arsenide of the top mirror.

A preferred solution when using metamorphic layers is nevertheless to make said junction between two layers of quaternary composition having an indium phosphide crystal lattice.

A second laser of the present invention is described below with reference to FIG. 2. Firstly, in entirely general manner, this second laser, like the first-described laser of the invention, comprises a succession of semiconductor layers constituting a chip 102 and mutually superposed in an area ZP, ZC of said chip. A first portion of said succession of semiconductor layers constitutes a light-amplifying structure 112, 114, 116 suitable for amplifying light internally in said laser in response to a one-way electric current constituting pumping current and passing through said successive of layers in an active zone of said area. A second portion of said succession comprises layers having doping concentrations that are sufficient to constitute a tunnel junction suitable for allowing said pumping current to pass in the reverse direction of said junction. Compared with the first laser, this second laser is characterized in that said layers having doping concentrations that are sufficient to constitute a tunnel junction are buried layers 124, 126 occupying only a current confinement zone ZC constituted by a fraction of said area of the chip for the purpose of confining said pumping current in said zone when said current passes through said second portion of the succession of layers, said current confinement zone being such that said pumping current is concentrated in said active zone when it passes through said light-amplifying structure.

In this second laser, the tunnel junction thus serves not only, where necessary, to facilitate the passage of pumping current through the top mirror 120, but also to constitute means for confining said current to the vicinity of the amplifying structure 112, 114, 116, without it being necessary for that purpose to etch the top mirror. This makes it possible for the chip to be implemented in planar form. This also makes it possible to reduce the electrical resistance of the chip because the access resistance presented by the non-etched top mirror is smaller than that which would be presented by an etched mirror.

This method of confinement has already been used for pumping current in a fourth known surface emitting semiconductor laser. In the fourth known laser, the pumping current is inserted into the chip from a top electrode situated in the peripheral zone around the top mirror and it is only subsequently that the current is directed towards the central active zone. It can be confined in said zone by a blocking layer which is included in the chip and which is pierced by a window in the vicinity of the axis, such that said window constitutes a current confinement zone.

Compared with that fourth known laser, the second laser of the present invention has the specific advantage of its current confinement means constituted by the tunnel junction making it simultaneously possible to cause the pumping current to pass between said two extreme semiconductor layers having the same conductivity type. A second laser of the invention is described below in greater detail.

As shown in FIG. 2, the chip 102 of the laser has a bottom face 104 and a top face 106 occupying said area of the chip. It defines two vertical directions constituting an up direction DV going from said bottom face to said top face, and a down direction DW opposite to said up direction. Said semiconductor layers of said chip constitute a composite structure following one another mutually in said structure in the following order in a first one of said two vertical directions:

a first injection layer 112 having doping of a first type, N, and occupying said chip area;

an active layer 114 suitable for amplifying light by recombining charge carriers of opposite types, said active layer occupying said chip area; and a second injection layer 116 having doping of a second type, P, opposite to said first type and occupying said chip area, said first injection layer, said active layer, and said second injection layer constituting said light-amplifying structure.

In the second, third, and fourth lasers described below, said first vertical direction is the up direction.

In accordance with the present invention, the composite structure then comprises:

a first tunnel junction layer 124 having doping of said second type, P, at a high doping concentration and occupying only said current confinement zone;

a second tunnel junction zone 126 having doping of said first type at a high doping concentration and occupying only said current confinement zone; and an access layer 128 having doping of said first type and occupying said chip area. In said current confinement zone, the access layer covers said second junction layer. However, in the fraction of said chip area lying outside said current confinement zone, this access layer covers the second injection layer. Said high doping concentrations are greater than the doping concentrations of the first and second injection layers and of the access layer. They constitute said doping concentrations that are sufficient for said set of two tunnel junction layers to constitute said tunnel junction. The doping concentrations of the second injection layer and of the access layer are such that these two layers together constitute a blocking junction for the pumping current outside said current confinement zone.

The laser given by way of example further comprises:

a bottom electrode 122 formed beneath said composite structure;

a bottom mirror 118 formed beneath said composite structure;

a top mirror 120 formed above said composite structure and co-operating with said bottom mirror to form the optical cavity of said laser; and a top electrode 123 formed above said composite structure and co-operating with said bottom electrode 122 to enable said pumping current to be passed through said chip 102.

Said first and second tunnel junction layers 124 and 126 are preferably constituted of materials having respective refractive indices greater than the respective refractive indices of said second injection layer 116 and of said access layer 128. These tunnel junction layers then constitute, at least in part, optical mode localizing means such that the power presented by laser light oscillation in said amplifying structure 112, 114, 116 is cut-off substantially at the edges of said active zone ZC with the aid of said mode localizing means. The light oscillation is that which the gain of the amplifying structure causes to develop in the optical cavity of the laser. This mode localizing means prevents a significant fraction of the power of said oscillation overflowing from the desired active zone, and simultaneously it prevents said power being significantly attenuated in said zone on approaching the edges thereof. In other words, it enables a sharper transition to be obtained between the optical power densities inside and outside the active zone.

In the lasers described below, the second injection layer 116 and said access layer 128 are both constituted by indium phosphide, and the tunnel junction layers 124 and 126 are constituted by a III–V type semiconductor material having ternary or quaternary composition. It is known that such a material is made up of at least three elements, at least one of which belongs to each of the types III and V.

Whatever the base material of the laser chip, indium phosphide, gallium arsenide, or a more complex compound, the higher refractive indices of the tunnel junction layers can usefully be obtained only by having a difference between the compositions of said layers and the compositions of the surrounding semiconductor materials. Under such circumstances, account needs to be taken of the fact that passing between two semiconductor materials of different compositions gives rise to a variation in an energy level that depends on the material under consideration. More particularly, on considering a diagram of the energy levels that may be occupied by the electrons in said material, in which diagram higher energies are plotted higher up the diagram, such a variation in energy level is that which concerns the high boundary of the valance band of the material. Insofar as such variation in energy level is large and sudden, ignoring the passage between an injection layer and the active layer, it gives rise to a potential difference that constitutes an obstacle to the passage of the laser pumping current. Another obstacle to the passage of this pumping current could also be constituted by the fact that a tunnel junction layer with very high doping concentration is simultaneously very fine and in contact with a layer having low doping concentration. Under such circumstances, the low concentration layer could capture charge carriers from the tunnel junction layer and thus oppose the tunnel effect which enables the current to pass. The presence of an obstacle as indicated above would cause the electrical power consumed by the laser to be increased, thereby also increasing the thermal power that needs to be evacuated. In the laser given as an example, the contribution of such obstacles is limited by the fact that some of said semiconductor layers constitute:

a first graded interface group 132, 134 interposed between said second injection layer 116 and said first tunnel junction layer 124; and a second graded interface group 130 interposed between said second tunnel junction layer 126 and said access layer 128. Each of these graded interface groups is constituted by at least one graded interface layer 130 interposed between two of said semiconductor layers 116, 132, and each graded interface layer is of a composition and/or a doping concentration intermediate between the compositions and/or the doping concentrations of said two semiconductor layers respectively.

The above-mentioned mode localizing means is constituted by the set of tunnel junction layers and the graded interface having compositions such as to give them refractive indices that are higher than those of the surrounding materials.

More particularly, the second laser of the present invention as given by way of example is adapted to emitting light having a wavelength of 1550 nm.

With reference to FIG. 2, the electrodes and the semiconductor layers of the second laser are described below in detail. Unless specified to the contrary, the semiconductor layers are constituted by indium phosphide InP and occupy the entire area of the chip 102, i.e. both zones ZP and ZC. The doping concentrations of said layers are given after the N or P conductivity type imparted to them by the doping. The electrodes and the layers follow one another in the following order in the direction DV:

The bottom electrode 122 formed on the bottom face 104 of the chip 102 and occupying the peripheral zone ZP.

The substrate 108. This substrate is 80 microns thick with N doping concentration of $2 \times 10^{18}$ cm$^{-3}$.

The bottom mirror 118. This mirror is constituted by an alternating periodic stack of InP layers of binary composition and $In_{0.66}Ga_{0.34}As_{0.74}P_{0.26}$ layers of quaternary composition. The layers of binary composition are 122.2 nm thick and have N doping at a concentration of $10^{18}$ cm$^{-3}$. The quaternary composition layers are 112.7 nm thick and have N doping at a concentration of $10^{18}$ cm$^{-3}$. The number of periods is equal to 45.

The first injection layer 112. This layer is 395.4 nm thick and has N doping concentration of $10^{18}$ cm$^{-3}$.

The active layer 114. This layer is composite and made up of the following elementary layers:
  a first barrier layer of composition $In_{0.79}Ga_{0.21}As_{0.45}P_{0.55}$, of thickness 10 nm, and not intentionally doped;
  a periodic stack made up of alternating quantum wells having a composition of $In_{0.79}Ga_{0.21}As_{0.75}P_{0.25}$, a thickness of 8 nm and not intentionally doped, and barriers having a composition of $In_{0.79}Ga_{0.21}As_{0.75}P_{0.55}$, a thickness of 10 nm, and not intentionally doped. The number of periods is equal to 9.

The second injection layer 116. This layer is 600 nm thick and has P-type doping at a concentration of $10^{18}$ cm$^{-3}$.

A tunnel junction assembly 125 occupying only the current confinement zone ZC. This assembly is constituted by five layers, as follows:
  a graded interface layer 130, said layer having a composition of $In_{0.79}Ga_{0.21}As_{0.45}P_{0.55}$, a thickness of 20 nm, and a P-type doping concentration of $10^{18}$ cm$^{-3}$;
  a graded interface layer 132, said layer having a composition of $In_{0.66}Ga_{0/34}As_{0.74}P_{0.26}$, a thickness of 20 nm, and a P-type doping concentration of $10^{18}$ cm$^{-3}$, said layers 130 and 132 constituting the first graded interface group;
  the first tunnel junction layer 124, said layer having a composition of $In_{0.66}Ga_{0.34}As_{0.74}P_{0.26}$, a thickness of 20 nm, and a P-type doping concentration of $3 \times 10^{19}$ cm$^{-3}$;
  the second tunnel junction layer 126, said layer having a composition of $In_{0.66}Ga_{0.34}As_{0.74}P_{0.26}$, a thickness of 40 nm, and an N-type doping concentration of $3 \times 10^{18}$ cm$^{-3}$; and
  a graded interface layer 134, said layer having a composition of $In_{0.66}Ga_{0.34}As_{0.74}P_{0.26}$, a thickness of 20 nm, and an N-type doping concentration of $10^{18}$ cm$^{-3}$, said layer constituting the second graded interface group.

The access layer 128. This layer has a thickness of 500 nm and an N-type doping concentration of $10^{18}$ cm$^{-3}$.

The top mirror 120 constituted by an alternating periodic stack of GaAs layers of binary composition and $Al_{0.9}Ga_{0.1}As$ layers of ternary composition. The binary composition layers have a thickness of 115 nm and an N-type doping concentration of $10^{18}$ cm$^{-3}$. The ternary composition layers have a thickness of 132 nm and an N-type doping concentration of $10^{18}$ cm$^{-3}$. The number of periods is equal to 30. The interfaces between the two materials have composition grading so as to facilitate the passage of electric current.

A phase matching layer 136 having GaAs composition, a thickness of 207.7 nm, and N-type doping concentration of $10^{18}$ cm$^{-3}$. The thicknesses of the semiconductor layers are adjusted so as to form a cavity that is resonant at the Bragg wavelength of the mirrors (1550 nm in the example under consideration).

Finally, the top electrode 123.

Fabrication of the above-described laser comprises the following steps, with epitaxial deposits being implemented in a conventional epitaxy enclosure:

Step 1

Epitaxial deposition of layers 118, 112, 114, 116, over the entire top face of an initial substrate that is of sufficient thickness to allow subsequent handling to be performed, and deposition of the initial layers which, after subsequent etching, will constitute the tunnel junction assembly 125.

Step 2

Defining the current-passing zone by etching said initial layers for the assembly 125, the non-etched portion constituting said assembly. Said zone is square in shape (of side 10 microns). Its sides are oriented along the [110] axes of the crystal lattice of the chip to facilitate restarting epitaxy in the following step.

Step 3

Epitaxially depositing the layer 128 over the entire area of the substrate.

Step 4

Depositing the successive layers of the top mirror 120 in the epitaxy enclosure.

Step 5

Depositing the layer 136 in said enclosure.

Step 6

After removal from the epitaxy enclosure, depositing a 250 nm thick layer of gold on the top mirror for increasing the reflection coefficient of the mirror and to form the top electrode 123.

Step 7

Thinning the substrate by polishing so as to form the final substrate 108 with a thickness of 80 microns.

Step 8

Depositing a metal layer on the bottom face of the substrate. A central opening having a diameter of 100 microns is etched in said layer to enable the laser to be emitted through the substrate. The remaining portion of said layer constitutes the electrode 122.

FIGS. 3, 4, and 5 show lasers constituted by elements analogous to those of the second laser shown in FIG. 2. When an element in any one of these three lasers performs a function analogous to the function performed by an element of the second laser, it is given the same reference numeral except that the hundreds digit of the reference numeral is the digit 2, the digit 3, or the digit 4, respectively, instead of being the digit 1. The elements may be made up in the same way, unless specified to the contrary.

In FIG. 3, a third laser of the invention has the following successive elements: a bottom electrode 222, a substrate 208, a bottom mirror 218, a first injection layer 212, and active layer 214, a second injection layer 216, an access layer 228, a tunnel junction assembly 225, a top mirror 220, and a top electrode 223.

This third laser is generally analogous to the second laser described above. It differs by the fact that its top mirror 220 is constituted by dielectric is layers such that the pumping current cannot be injected through the mirror. To enable said current to be injected, the mirror is etched, i.e. it is made in two steps, a first step being to deposit the dielectric layers constituting the mirror over the entire area of the chip, and the second step being etching said layers so that they remain only in a central zone which may project beyond the current confinement zone. The top electrode 123 is then deposited over the entire area of the chip so as to enable pumping current to be injected into the access layer 228 from that fraction of the area of the chin that lies outside the top mirror. Thereafter, the current follows a r curved path as shown by arrows such as 238, enabling it to reach the tunnel junction assembly 225. This can be called a "lateral injection" disposition. It can be preferable in some cases to injection through the top mirror as used in the second laser of the present invention. In such cases, the present invention enable the substrate 208 and the access layer 228 to be both of the N conductivity type, and for current-passing purposes through the access layer, as compared with an access layer having P-type conductivity, this has the advantages both of lower access resistance and of more uniform distribution of the current in the active zone.

FIG. 4 shows a fourth laser of the present invention comprising the following successive elements: a bottom electrode 322, a substrate 308, a bottom mirror 318, a first injection layer 312, an active layer 314, a second injection layer 316, a tunnel junction assembly 325, an access layer 328, a top mirror 320, and a ton electrode 323.

This fourth laser is generally analogous to the above-described third laser of the invention. It differs by the fact that the bottom electrode 322 occupies the entire bottom face of the chip, while the top electrode 323 is pierced by a window 340 to allow the laser light to be emitted from the top face after passing through the top mirror 320. The respective reflectances of said mirror and of the bottom mirror 318 are adapted to this configuration. This has the particular advantage of avoiding passing the light through the substrate 308. It suffers from a drawback which can be fatal in applications where the dissipated thermal power is high. This drawback is that it is relatively difficult to remove thermal power from the bottom face of the chip because the heat then needs to be extracted through the substrate.

In FIG. 5, a fifth laser of the invention has the following successive elements (going upwards): a bottom electrode 422, a substrate 408, a bottom mirror 418, an access layer 428, a so-called "second" injection layer 416, an active layer 414, a so-called "first" injection layer 412, a tunnel junction assembly 425, a top mirror 420, and a top electrode 423.

This fifth laser is generally analogous to the above-described second laser of the invention. It differs by the fact that its tunnel junction assembly 425 is placed between its active layer 414 and its substrate 408, i.e. the order in which successive steps of epitaxial deposition are performed is different and said first vertical direction as mentioned in the general description of the invention when describing the seccession of layers of said composite structure is no longer the up direction in this case, but the down direction. This results in a curved active layer, the active layer projecting in the active zone, and in a corresponding reduction in the distance between said layer and the top mirror in said zone.

We claim:

1. A surface emitting semiconductor laser, said laser comprising an optical cavity and a light-amplifying structure situated in said cavity and defining the direction of a laser pumping current, wherein said optical cavity is placed electrically in series between two extreme semiconductor layers forming mirror layers of said laser and having the same conductivity type, two semiconductor layers of said laser being placed optically in series with said cavity and constituting a tunnel junction enabling said pumping current to pass in series through said amplifying structure and said junction in the reverse direction of said junction.

2. A laser according to claim 1, said laser comprising semiconductor layers constituting a chip having a bottom face and a top face, said chip defining two vertical directions constituting an up direction going from said bottom face to said top face, and a down direction opposite to said up direction, said semiconductor layers in said chip constituting a composite structure following one another in said structure in the following order in a first of said two vertical directions:

a first injection layer having doping of a first type and a doping concentration;

an active layer suitable for amplifying light by recombining charge carriers of opposite types;

a second injection layer having doping of a second type opposite to said first type, and a doping concentration, said first injection layer, said active layer, and said second injection layer constituting said light-aamplifying structure;

a first tunnel junction layer having doping of said second type and a doping concentration; and a second tunnel junction layer having doping of said first type and a doping concentration, said doping concentrations of said first and second tunnel junction layers being greater than said doping concentrations of said first and second injection layers, and being sufficient to enable said set of two tunnel junction layers to constitute said tunnel junction;

said laser further comprising:

a bottom electrode formed beneath said composite structure;

a bottom mirror formed beneath said composite structure;

a top mirror formed above said composite structure and co-operating with said bottom mirror to form said optical cavity of said laser; and a top electrode formed above said composite structure and co-operating with said bottom electrode to enable said pumping current to pass through said chip.

3. A laser according to claim 2, said first and second injection layers being constituted by a III–V type binary compound, said first vertical direction being said up direction, said first and second conductivity types being respectively N type and P type, and said composite structure being formed above a semiconductor substrate having doping of N-type conductivity.

4. A laser according to claim 2, wherein each of said tunnel junction layers has thickness lying in the range 10 nm to 300 nm.

5. A laser according to claim 4, said thickness of each of said tunnel junction layers lying in the range about 15 nm to about 50 nm.

6. A laser according to claim 2, said light-amplifying structure occupying an area of said chip, said optical cavity occupying only an active zone constituted by a fraction of said area, wherein said first and second tunnel junction layers are buried layers occupying only a current confinement zone constituted by a fraction of said area of the chip and substantially coinciding with said active area, said composite structure further comprising an access layer having doping of said first type and occupying said area of the chip, said access layer covering said second layer of the tunnel junction in said current confinement zone, said access layer covering said second injection layer in the fraction of said area of the chip lying outside said current confinement zone, said doping concentrations of the second injection layer and of the access layer being such that these two layers together constitute a junction that blocks said pumping current outside said current confinement layer.

7. A laser according to claim 6, wherein said first and second tunnel junction layers are constituted by materials having respective refractive indices greater than the respective refractive indices of said second injection layer and said access layer, said tunnel junction layers constituting optical mode localizing means such that the power presented by optical oscillation of said laser in said amplifying structure is substantially cut off at the edges of said active zone with the help of said mode localizing means.

8. A laser according to claim 7, said second injection layer and said access layer being constituted by indium phosphide, said tunnel junction layers being constituted by a III–V type semiconductor material made up of at least three elements, including at least one from each of types III and V.

9. A laser according to claim 7, wherein certain of said semiconductor layers constitute:

a first graded interface group interposed between said second injection layer and said first tunnel junction layer; and a second graded interface group interposed between said second tunnel junction layer and said access layer, each of said graded interface groups being constituted by at least one graded interface layer interposed between two of said semiconductor layers, and having a composition and/or a doping concentration intermediate between the compositions and/or the doping concentrations of said two semiconductor layers, respectively.

10. A laser according to claim 2, said optical cavity having an axis extending along one of said vertical directions, said chip including a central zone in the vicinity of said axis, and a peripheral zone around said central zone, an active zone of said active layer substantially coinciding with said central zone, said top electrode and said top mirror being formed only in said central zone on said top face of the chip, said bottom electrode being formed in said peripheral zone to the exclusion of said central zone so as to allow light emitted by said laser to escape from said chip through said bottom face in said central zone, those of said semiconductor layers which are situated between said bottom face and said active layer being of thicknesses and of electrical conductivities which are large enough to enable said pumping current to pass through said active layer in said active zone.

\* \* \* \* \*